United States Patent [19]

Scheer et al.

[11] Patent Number: 5,619,660
[45] Date of Patent: Apr. 8, 1997

[54] KEYING NOTCHES FOR SIDE CONTACTS ON A THIN FORM FACTOR COMPUTER CARD

[75] Inventors: David C. Scheer, Pollock Pines; Robert J. Gormley, Citrus Heights; Michael E. Pierce, Orangeville; Patrick E. Weston, Cameron Park, all of Calif.

[73] Assignee: Intel Corporation, Santa Clara, Calif.

[21] Appl. No.: 234,481

[22] Filed: Apr. 28, 1994

[51] Int. Cl.$^6$ .................................................. G06F 13/00
[52] U.S. Cl. .......................... 395/282; 395/800; 361/737
[58] Field of Search .................................... 395/800, 830, 395/831, 834, 837, 883, 884, 892, 282; 340/516, 517, 518, 593; 361/644, 657, 679, 686, 715, 720, 722, 736, 737, 748; 439/55, 59, 61

[56] References Cited

U.S. PATENT DOCUMENTS

| | | |
|---|---|---|
| Re. 34,369 | 9/1993 | Darden et al. . |
| 4,530,069 | 7/1985 | Desrochers . |
| 4,695,925 | 9/1987 | Kodai et al. . |
| 4,811,165 | 3/1989 | Currier et al. . |
| 4,951,280 | 8/1990 | McCool et al. . |
| 5,183,404 | 2/1993 | Aldous et al. . |
| 5,184,282 | 2/1993 | Kaneda et al. . |
| 5,207,586 | 5/1993 | MacGregor et al. . |
| 5,272,477 | 12/1993 | Tashima et al. . |
| 5,285,057 | 2/1994 | Murohara . |
| 5,296,692 | 3/1994 | Shino . |
| 5,296,850 | 3/1994 | King . |
| 5,303,121 | 4/1994 | Thornberg . |
| 5,313,364 | 5/1994 | Omori et al. . |

OTHER PUBLICATIONS

No author, *PCMCIA, Personal Computer Memory Card International Association PC Card Standard, Release 2.0*, 3–13 through 3–26 (Sep. 1991).
No author, *PCMCIA Recommended Extensions, Release 1.00*, 1–3 through 1–8 (1992).

*Primary Examiner*—Alpesh M. Shah
*Attorney, Agent, or Firm*—Blakely, Sokoloff, Taylor & Zafman

[57] ABSTRACT

An integrated circuit (IC) card and corresponding computer IC card receptacle apparatus is described which provides for enhanced electrical isolation of the IC card's side contacts during insertion, and which provides for enhanced IC card security features. The apparatus includes an IC card containing a side contact located within a recessed keyed notch along a side edge. The apparatus also includes an IC card receptacle containing the corresponding side electrical contact on a keyed control arm. The keyed control arm is keyed for the recessed keyed notch of the IC card, such that the electrical contact on the keyed control arm remains electrically isolated until the IC card is completely inserted into the receptacle. The control arm may be coupled to a locking mechanism so that the IC card is forcibly retained in the IC card receptacle until released. Additional electrical isolation of the IC card receptacle's side contact may provided for by an IC card insertion detector and switch, which keeps the IC card receptacle side contact electrically isolated from the remainder of the computer system until the IC card is detected as being fully inserted.

13 Claims, 7 Drawing Sheets

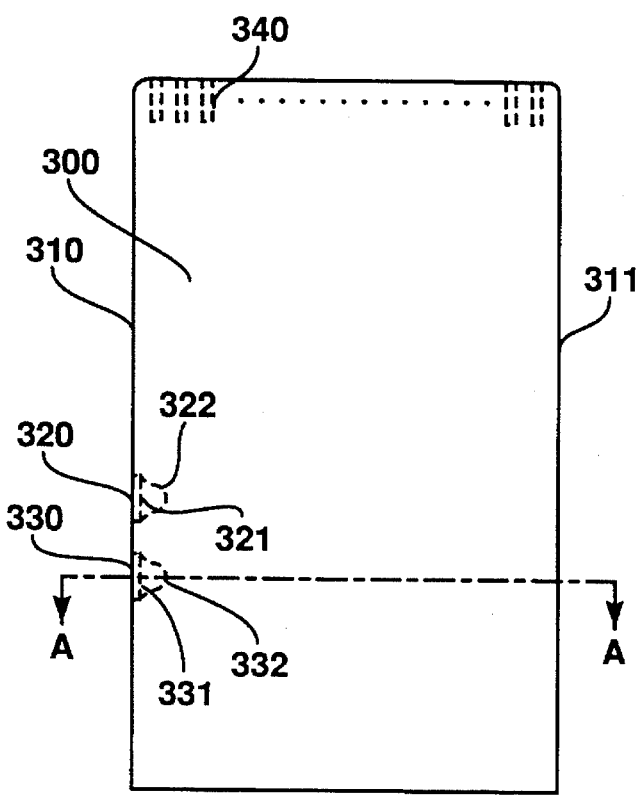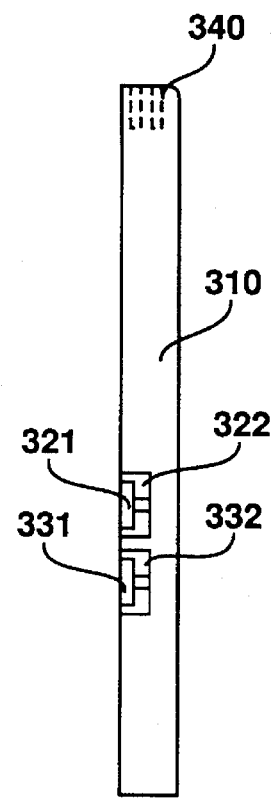
FIGURE 3A  FIGURE 3B
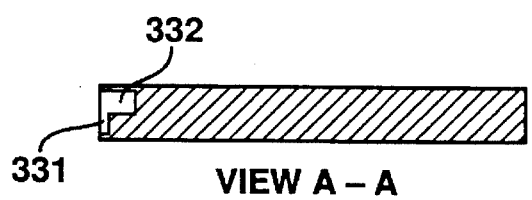
VIEW A – A
FIGURE 3C

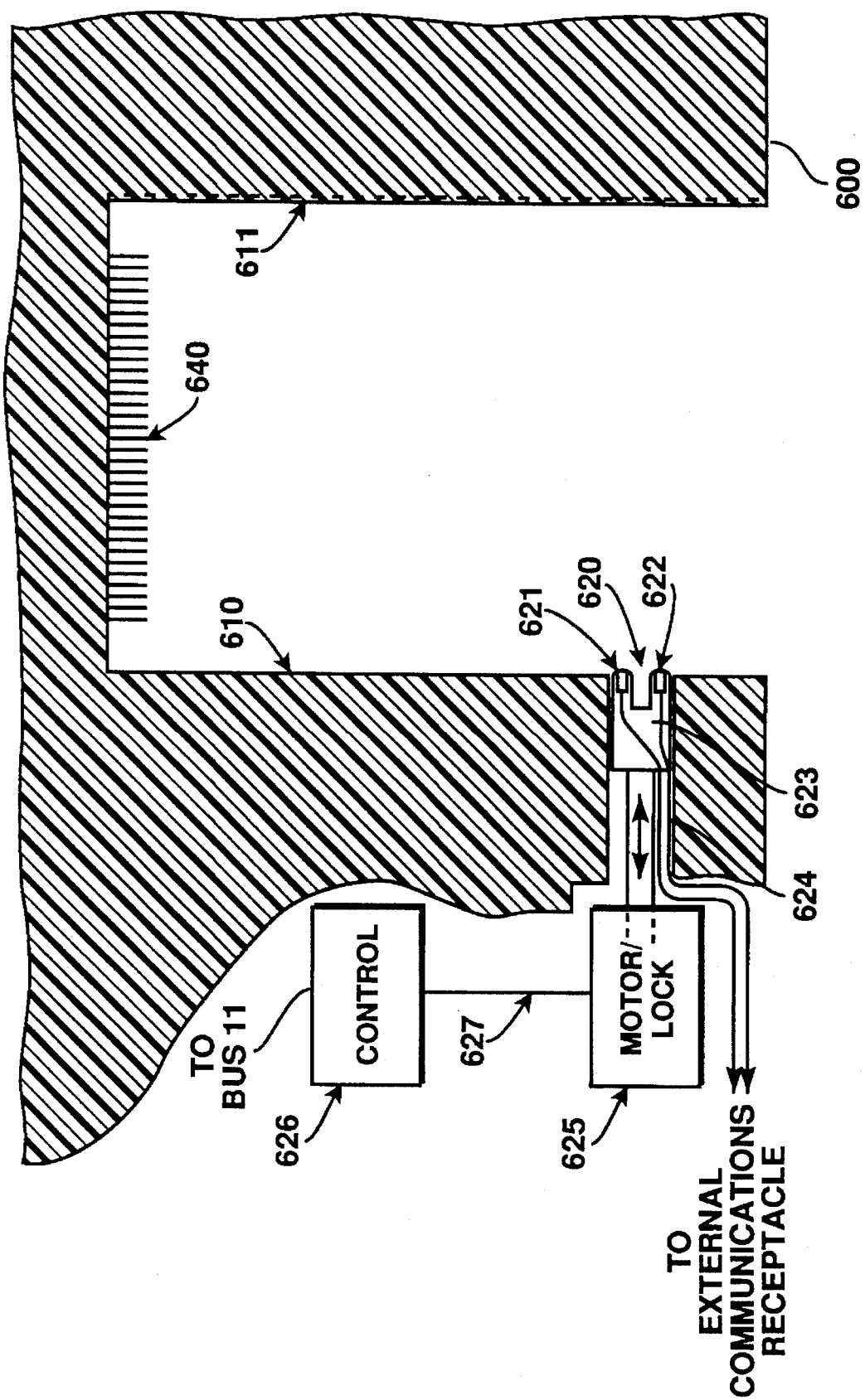

KEYING NOTCHES FOR SIDE CONTACTS ON A THIN FORM FACTOR COMPUTER CARD

CROSS-REFERENCE TO RELATED APPLICATIONS

The following co-pending U.S. patent applications relate to the present application. Each of the listed co-pending applications are assigned to the same assignee as the present application.

1) U.S. patent application Ser. No. 08/009,135, Filed Jan. 26, 1993, and titled, "METHOD AND APPARATUS FOR PROPAGATING SIGNALS ON INTEGRATED CIRCUIT CARDS"
2) U.S. patent application Ser. No. 08/249,290, Filed May 26, 1994, now U.S. Pat. No. 5,423,697, and titled, "MODULAR COMMUNICATIONS CONNECTOR FOR I/O CARD APPLICATIONS"
3) U.S. patent application Ser. No. 08/243,228, Filed May 13, 1994, now U.S. Pat. No. 5,505,633, and titled, "INTEGRAL EXTERNAL CONNECTOR INTERFACE FOR THIN FOR FACTOR COMPUTER CARDS"
4) U.S. patent application Ser. No. 08/241,722, Filed May 12, 1994, now U.S. Pat. No. 5,445,525, and titled, "INTERCONNECTION SCHEME FOR INTEGRATED CIRCUIT CARD WITH AUXILIARY CONTACTS"

FIELD OF THE INVENTION

The present invention relates to the field of removably insertable integrated circuit (IC) cards for use in computer systems. Specifically, the present invention relates to an integrated circuit card containing keyed side notches for providing enhanced electrical isolation and IC card security features.

BACKGROUND OF THE INVENTION

Portable computers have recently become more powerful while at the same time becoming lighter and smaller. Peripheral devices are often used in conjunction with the portable computer to provide increased functionality, such as communications ability or enhanced data storage. One example of a peripheral device is a modem, which allows a user of a portable computer to communicate with other computers using telephone lines. Reduction in the size of peripheral devices has accompanied reductions in the size of portable computers.

Some portable computer systems and peripheral devices, modems in particular, have been designed recently such that the peripheral device is contained on a thin form factor computer card which plugs into a socket recessed within the body of the computer. Such peripheral devices can be carried along with the portable computer and inserted when needed.

Historically, each of the peripheral devices (e.g. modems, memory devices, facsimile, LANs, etc.) has required its own interface circuitry for connecting to the internal circuitry of a portable computer. This interface circuitry required a separate socket for each device, and thus more space in the portable computer. For example, a modem card and a memory card each required a separate socket, and thus two sockets were necessary even though only one was in use at a given time.

Recently, devices have been devised which allow some of these various forms of computer components to be plugged into the same socket of the computer, thereby reducing space required within the portable computer. For example, an international standard which defines the physical and electrical interface specifications for the interchangeability of memory and input/output cards was introduced by the Personal Computer Memory Card International Association (PCMCIA) jointly with the Japanese Electrical Industry Association (JEIDA) in September of 1991. In addition, a specification referred to as an Exchangeable Card Architecture (ExCA) specification, dated Dec. 20, 1991, has been issued by Intel Corporation of Santa Clara, Calif. The ExCA document describes specifications which manufacturers may use to provide interfaces which are ensured of allowing the memory and input/output cards for portable personal computers of different manufacturers to be interchanged.

A socket designed to these specifications allows cards, such as modem and flash memories, to be inserted, used, and removed interchangeably in the same socket. The computer systems used typically contained at least one socket recessed within the computer, such that the inserted computer card containing the modem, flash memory, etc., is protected by the body of the computer surrounding the socket in which the components are coupled.

The PCMCIA specification provides that the personal computer cards have a 68-pin connector located at the end of the card for transmitting signals between the computer and the card. Many system manufacturers desire to connect to critical signals on the integrated circuit card which are not available through the 68-pin connector. Prior art systems are known for achieving access to signals on removably insertable integrated circuit cards other than those accessed by a standard interface.

One problem that exists in an insertable integrated circuit (IC) card system using a side-contact regime is where the side contacts are used to achieve tip-ring connections for a modem card. Two side contacts of the computer IC card socket in this case are coupled to an RJ11 port contained in the side of the computer. However, if the surface of the IC card is comprised of conducting material, then the two side contacts, and hence the tip-ring leads of the telephone fine, will be shorted together for a time during insertion of the IC card. This is an undesirable phenomenon in violation of FCC regulations because a tip-ring short specifies to the telephone central office an "off-hook" condition on the telephone line, which is clearly not the intention of the user during IC card insertion. Additionally, the card to be inserted may not even be a side-contacting card, but may be one of the many types of PCMCIA-compatible cards. If the inserted card comprises a conducting surface, and if the external telephone line is incidentally kept in place by the user, a false "off-hook" condition takes place constantly.

This problem is not limited to cases in which the socket is arranged with side contacts to accommodate modem cards. In general, even if the side contacts have other purposes (for example, local area network (LAN) card contacts), there will be problems when components on or within the computer coupled to these side contacts of the IC card socket are not electrically isolated before full insertion of the appropriate IC card.

Another problem related to removably insertable integrated circuit cards regards their cost compared to their relative ease of theft. Portable computers, by their very nature, are susceptible to theft due to the wide variety of places to which they are transported, used, and stored.

Portable computers can sometimes be left unattended by the user in places less familiar to the user. Additionally, however, it is easy to imagine a situation where theft of a pocket-sized computer card is even easier to accomplish than theft of a portable computer, because a PCMCIA-standard card is almost as small as a credit card. Thus, with the proliferation of small computer cards comes a need, in many circumstances, to provide a level of security for the computer cards, making them at least as difficult to steal as the portable computer itself.

SUMMARY OF THE INVENTION

It is an object of the present invention to provide a portable computer system and a removably insertable integrated circuit card such that the side contacts in the computer's IC card socket remain electrically isolated until the appropriate IC card is fully inserted into the socket.

It is another object of the present invention to allow a computer IC card socket containing side contacts to accept many different types of insertable integrated circuit cards, including cards without corresponding side contacts.

It is yet another object of the present invention to prevent unauthorized removal or theft of the integrated circuit cards once they have been inserted through a mechanical security means.

These and other objects of the invention are provided for by a notched integrated circuit (IC) card and corresponding computer socket apparatus. The present invention provides an IC card containing a logic circuit for performing a designated function. The present invention further includes a primary electrical interface coupled to this logic circuit for transferring signals between the IC card and the computer system, and a secondary electrical contact for routing at least one signal on the IC card to a first external receptacle of the computer system. The present invention further includes an IC card frame enclosing the logic circuit, the IC card frame including a plurality of edges, at least one such edge being formed such that at least one recessed notch is defined along this edge, the secondary electrical contact being located within such recessed notch such that its conducting surface is contained beneath the plane of the edge in a way which allows an external pin to be brought into contact with its conducting surface only upon being brought beneath the plane of the edge. In one embodiment of the invention, a selectively-coupling IC card receptacle is provided which comprises a movable control arm keyed to the recessed notches of the desired computer card, and a locking mechanism coupled to the keyed control arm such that the keyed control arm is capable of forcibly retaining the IC card in the socket when the IC card is fully inserted and the keyed control arm fully extended into the recessed notches. In another embodiment of the invention additional electrical isolation of the IC card socket side contacts may be provided for by an IC card insertion detector and switch, coupled to the IC card socket in a way which keeps the IC card socket side contact electrically isolated from the external connection until the IC card is detected as being fully inserted.

BRIEF DESCRIPTION OF THE DRAWINGS

FIGS. 3A, 3B, and 3C illustrate a thin form factor integrated IC card with keyed notches according to a first embodiment of the present invention.

FIG. 6 illustrates a selectively-coupling IC card receptacle designed in accordance with a third embodiment of the present invention.

DETAILED DESCRIPTION OF THE PRESENT INVENTION

An apparatus for achieving an interface between a removably insertable integrated circuit card having side contacts and a computer system containing an external communications receptacle is described. In the following description, numerous details are set forth such as specific numbers of contacts, types of contacts, size of contacts, and types of signals, etc., in order to provide a thorough understanding of the present invention. It will be apparent, however, to one skilled in the art that the present invention may be practiced without these specific details. In other instances, well-known structures and devices are shown in block diagram form, rather than in detail, in order to avoid unnecessarily obscuring the present invention.

The present invention is advantageously employed in computer system design optimized for applications with lower power consumption or compact size. Such applications typically include small battery-powered personal computers of the type commonly referred to as laptops and notebooks. One preferred embodiment of such computer system is briefly described below; however, it is to be understood that the present invention is not limited to this particular computer system design and may be incorporated into virtually any processor-based system design.

Figure 1:
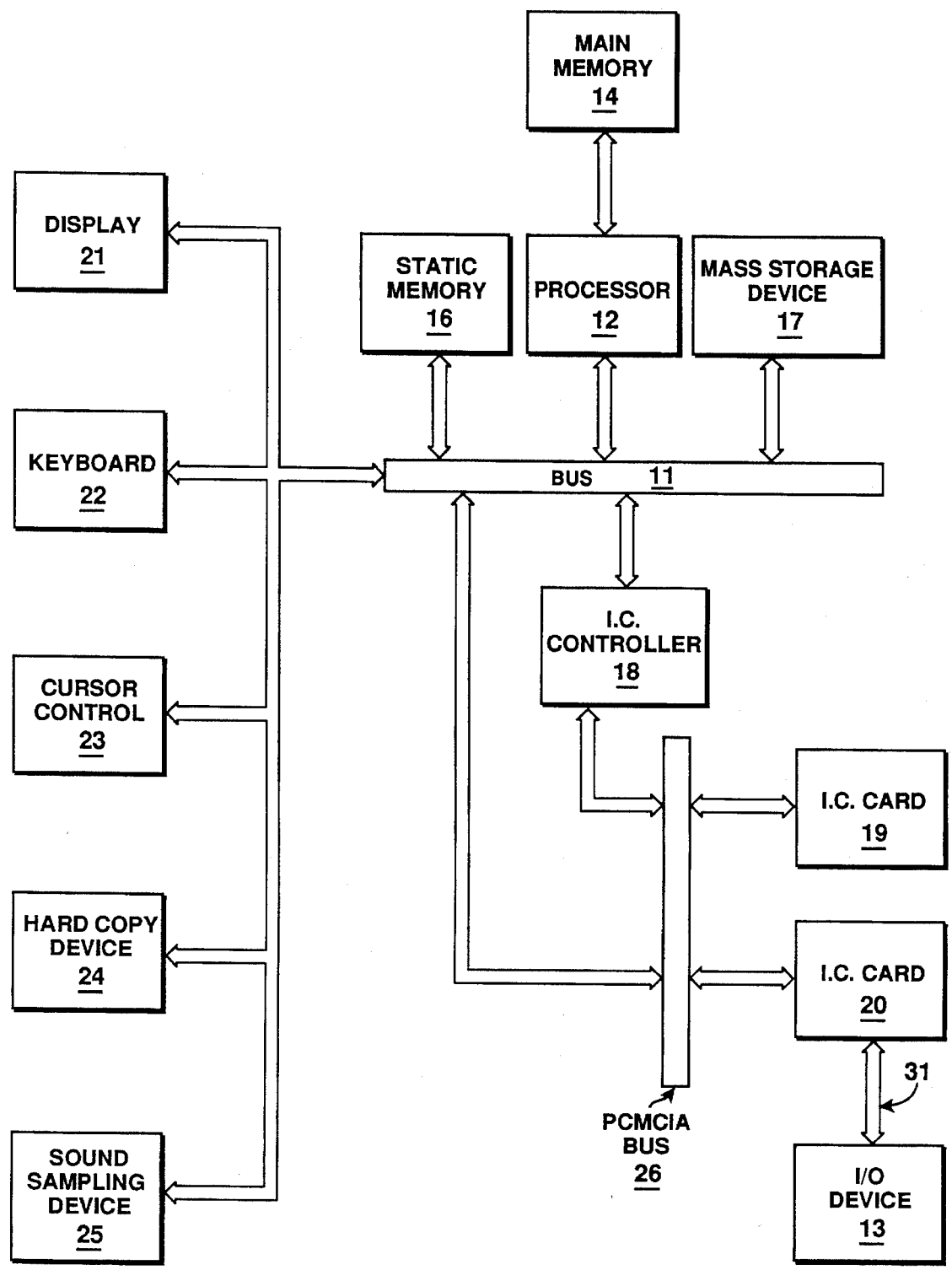
FIG. 1 illustrates a block diagram of a computer system for use with removably insertable integrated circuit cards.

Referring to FIG. 1, the preferred embodiment of the computer system of the present invention is shown. In the preferred embodiment, the computer system includes an Intel brand microprocessor manufactured by Intel Corporation of Santa Clara, Calif., the assignee of the present invention. Such computer system is compatible with the IBM™ PC Personal Computer. It will be understood while FIG. 1 is used for providing an overall description of the computer system of the present invention, a number of the details of the system are not shown. As necessary for disclosure of the present invention, further details are set forth with reference to the other figures provided with this specification.

The computer system in the preferred embodiment of the present invention generally comprises a bus for communication means 11 for communicating information, processing means 12 coupled with bus 11 for processing information, a random access memory (RAM) or other dynamic storage device 14 coupled with processing means 12 for storing information and instructions for processing means 12, a read only memory (ROM) or other non-volatile storage device 16 coupled with bus 11 for storing non-volatile information and instructions for processing means 12, a data storage device 17, such as a magnetic disk or disk drive, coupled with bus 11 for storing information and instructions, a display device 21, such as a cathode ray tube, liquid crystal display, etc., coupled to bus 11 for displaying information to the computer user, an alpha-numeric input device 22 including alpha-numeric and other keys, etc., coupled to bus 11 for communicating information and command selections to processor 12, and cursor control 23 coupled to bus 11 for controlling cursor movement. The computer system also includes a hard copy device 24, such as a plotter or printer, for providing visual representation of the computer images. Hard copy device 24 is coupled with processor 12, main memory 14, non-volatile storage device 16 and mass storage device 17 through bus 11. The computer system also includes a sound recording and playback device 25 coupled to bus 11 for providing audio recording and playback.

Integrated circuit (IC) cards 19 and 20 are included in the computer system and are coupled to PCMCIA bus 26. Note that although the computer system only shows two IC cards, the number of IC cards which may be coupled to the computer system may vary. In the currently preferred embodiment, IC cards 19 and 20 are PCMCIA cards. PCMCIA bus 26 is coupled to bus 11 and to integrated circuit (IC) controller 18 for providing communication information between cards 19 and 20 and the remainder of the computer system. In the currently preferred embodiment, PCMCIA bus 26 is a standard PCMCIA bus for communicating information according to the PCMCIA standard. Note that although IC cards 19 and 20 and PCMCIA bus 26 of the present invention communicate according to the PCMCIA standard, other interface types and configurations fall within the scope of the present invention. IC controller 18 provides control and address information to IC cards 19 and 20 via PCMCIA bus 26 and is coupled to bus 11. Also note that although the cards are shown coupled to PCMCIA bus 26, in the currently preferred embodiment the cards are not coupled to PCMCIA bus 26 until they are inserted into slots in the side of the computer, such that their standard interface (e.g., 68 pin PCMCIA standard interface) is mated with the interface pins (e.g., the 68 pins) within the computer system.

The computer system also includes a signal path or bus 31 (i.e., SideSwipe contact bus) for communicating information to IC card 20 by other than its standard interface. SideSwipe is a trademark of Intel Corporation. In one embodiment, signal path/bus 31 may only transfer one signal, while in other embodiments, bus 31 provides the signal path for multiple signals. Note that IC card 19 may be coupled to a SideSwipe contact bus as well.

Finally, the computer system includes input/output (I/O) device 13 for providing an input/output port or connector for the computer system. I/O device 13 is coupled to signal path/bus 31 for access to signals from IC card 20. The present invention relates to the electrical and mechanical nature of achieving the interconnection between the I/O device 13 and the IC card 20, as specifically related to electrical and mechanical elements of IC card side contacts and IC card receptacle/socket side contacts of the computer system.

In one embodiment, I/O device 13 could also be coupled to bus 11 for communication with the remainder of the computer system. In another embodiment, I/O device 13 comprises a jack or plug, such as an RJ11 jack, RJ45 jack or other proprietary or telephone port that is coupled to the PC chassis for input and output. In such a case the signal path/bus 31 represents tip-ring (T/R) telephone line paths. I/O device 13 can also include an infra-red antennae or a radio-frequency antennae or other communications device. Note that although only one I/O device is shown, the computer system of the present invention may include multiple I/O devices, and multiple I/O device may be coupled to a single IC card.

Of course certain implementations and uses of the present invention may not require or include all of the above components. For example in certain implementations a keyboard and cursor control device for inputting information to the system may not be required. In other implementations, it may not be required to provide a display device for displaying information. Also, some components may be coupled in other configurations. For instance, main memory 14 may be coupled directly to bus 11 instead of being coupled to processor 12 directly.

Figure 2A:
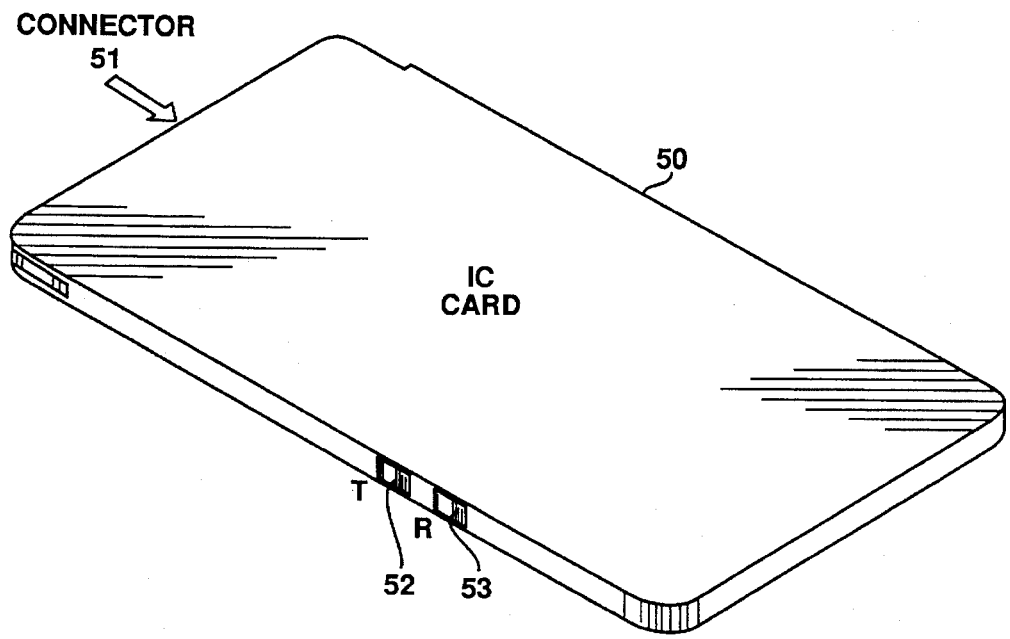
FIGS. 2A, and 2B represent a prior art integrated circuit (IC) card and IC card receptacle, respectively, for use in the computer system of FIG. 1.
Figure 2B:
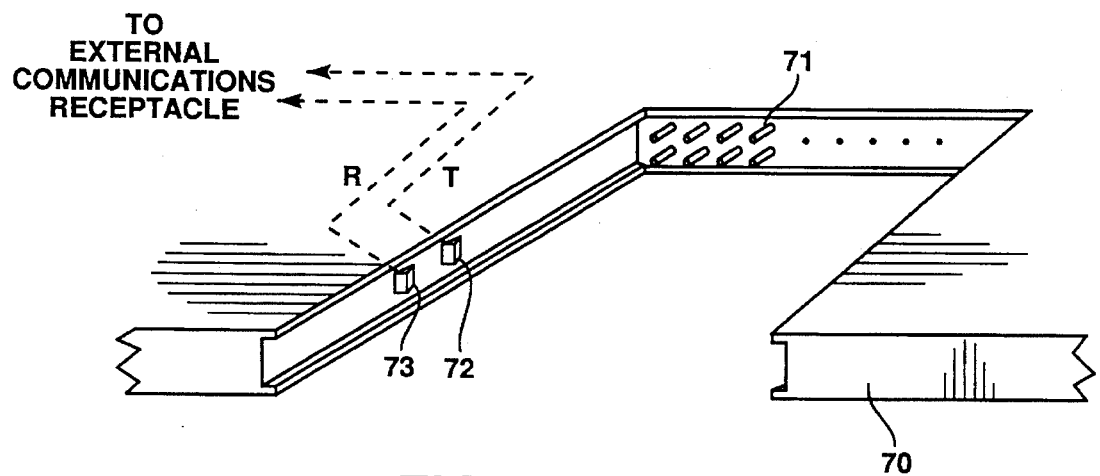

FIGS. 2A and 2B represent the prior art IC card and IC card receptacle used in the above computer system. FIG. 2A shows an IC card 50 of general rectangular block shape and including at a front end a standardized interface connector 51. The IC card 50 of FIG. 2A represents a modem card, for example. The tip-ring connections for the modem card 50 are achieved using SideSwipe contacts 52 and 53, respectively.

FIG. 2B shows the receptacle 70 of the prior art which is designed with standardized interface connectors 71 for connecting to the connectors 51 of the IC card. FIG. 2B also includes SideSwipe contacts 72 and 73 which correspond to SideSwipe contacts 52 and 53 of the IC card. Contacts 72 and 73 are in turn coupled to an external communications receptacle which, in this example, provides the tip-ring telephone connections for use by the IC modem card 50 when inserted into the receptacle.

Problems can arise where the SideSwipe contacts 52 and 53 are flush with the side edge of the IC card 50 and where the SideSwipe contacts 72 and 73 of the receptacle protrude into the interior of the receptacle, unprotected and unkeyed, for mating with the contacts 52 and 53 upon insertion. One problem which can arise, for example, if the surface of the IC card 50 is a conducting surface. In this case, during insertion, the tip and ring leads of the telephone line, which appear at the connectors 72 and 73, respectively, will be shorted together via the conducting surface 50. This is an undesired result because a short between tip and ring represents an "off-hook" condition to the telephone central office, which would then in turn attempt to provide dial tone to this non-ready apparatus.

Another problem can arise when the configuration of FIG. 2B is used with a non-SideSwipe card. In such a case, if the surface of the non-SideSwipe card (not illustrated) is a conducting surface, and if the telephone line connection is maintained at the external communications receptacle, and is thus present at tip-ring leads 72 and 73, there will be a false "off-hook" condition for the entire duration of the presence of the non-SideSwipe card.

Yet another problem which can arise is if a SideSwipe IC card is inserted containing similar side contacts to the modem card 50 but where the side contacts are for a different purpose (e.g. for a LAN card and not a modem card). In this case it is conceivable that the inserted card may be damaged due to the present tip-ring voltage on connectors 72 and 73, for which the inserted card is not designed.

Another problem is also possible. If the receptacle is made of metal or is a non-SideSwipe device or system, the receptacle can short the contacts together on the card possibly causing damage to the card.

FIGS. 3A, 3B, and 3C show a thin form factor IC card forming keyed notches along a side in accordance with a first embodiment of the present invention. FIG. 3A shows a notched IC card 300 the basic structure of which is similar to the IC card 50 of FIG. 2A but with modifications which are the subject of a part of the present invention. Notched IC card 300 includes edges 310 and 311, along with standard interface connections 340, as shown in FIGS. 3A, and 3B. Notched IC card 300 is formed so as to define two keyed notches 320 and 330 along an edge 310, as shown in FIGS. 3A and 3B. The keyed notches 320 and 330 are formed along edge 310 using well-known manufacturing techniques which can shape the frame of the card 300 along its edge 310. The notch 320 includes a conducting surface 321 which is located beneath the plane of the edge 310. The notch 320 further includes a nonconducting surface 322 which is formed into a geometric shape, in this embodiment the shape being similar to a trapezoidal solid. It is noted that the shape of the nonconducting surface 322, in this embodiment of the invention being a trapezoidal solid, can be any of a variety of "keyed" shapes. The conducting surface 321 is located within the notch 320 such that an external conductor would need to break the plane of the edge 310 in order to contact the conducting surface 321 and therefore create an electrical connection. The external conductor would need to fit within the shape defined by notch 320 in order to achieve such connection. It is important at this point to note that an external conductor which is affixed to a non-conducting shroud would, additionally, not be able to establish electrical contact with the conducting surface 321 unless the nonconducting shroud fitted the keyed shape of the nonconducting surface 322.

FIGS. 3A, 3B, and 3C further show a notch 330 defined along edge 310. The notch 330 includes a conducting surface 331 and a nonconducting surface 332. In FIG. 3A it is noted that notches 320 and 330 are similar to each other in size and shape. However, the invention is not so limited. The geometric keyed shapes formed by notches 320 and 330 can be different from each other in other embodiments of the invention. The differences in shape can be such that an external connector keyed to fit within the first notch may not be able to fit into the second notch, or vice versa. In all embodiments of the invention, however, the conducting surfaces (elements 321 and 331 of FIGS. 3A, 3B, and 3C for example) need to be contained below the plane defined by the edge 310.

It is further noted that FIGS. 3A, 3B, and 3C depict only two notches, each containing a conductive surface for transferring electrical signals to and from the IC card 300. The invention is not limited to two notches/conductors, but can contain any number (one or more) of notches/conductors. FIGS. 3A, and 3B also depict the notches 320 and 330 as being formed along edge 310. The invention, however, may include such keyed notches on either edge 310 or 311 of the card 300, or along both edges 310 and 311 or in any combination thereof.

Figure 4A:
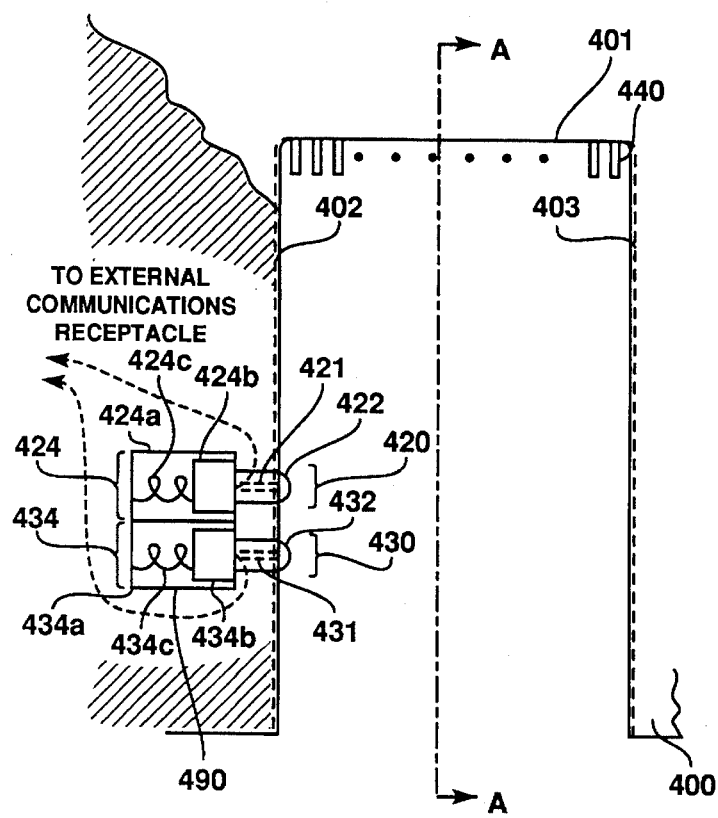
FIGS. 4A, 4B, and 4C illustrate a selectively-coupling IC card receptacle designed in accordance with the first embodiment of the present invention.

FIG. 4A shows a selectively-coupling IC card receptacle 400 designed in accordance with the first embodiment of the present invention. The selectively-coupling IC card receptacle includes a primary surface 401 upon which is positioned a standard primary electrical interface 440, which may include, but is not limited to, a PCMCIA standard 68-pin interface. The IC card receptacle 400 further includes secondary surfaces 402 and 403 such that an inserted IC card is received and supported. The surfaces 402 and 403 include flanges 402a and 403a, respectively, at their upper and lower edges such that the inserted IC card is supported. It is noted, however, that the invention is not limited to receptacles which need such flanges 402a and 403a in order to support the inserted IC card, since a receptacle which can support the frame of the inserted IC card by other means are also included in the scope of the present invention. It is further noted that the notched IC card 300 of FIG. 3A, which is of the SideSwipe type, may be the inserted card, or a nonnotched SideSwipe card such as that of FIGS. 2A, and 2B may be inserted, or a non-SideSwipe card may be inserted. The features of selectively-engaging IC card receptacle 400 described here are such that electrical coupling with a nonstandard interface on the IC card will only be achieved upon full insertion of an appropriately-keyed, notched IC card such as that of FIGS. 3A, 3B, and 3C which are one of the objects of the present invention.

Figure 4B:
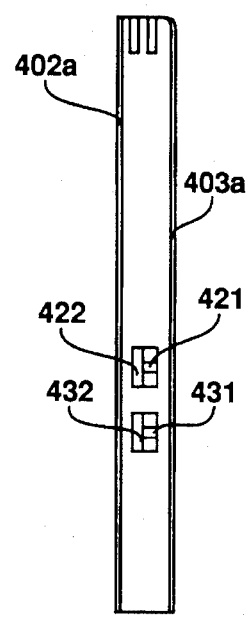
Figure 4C:
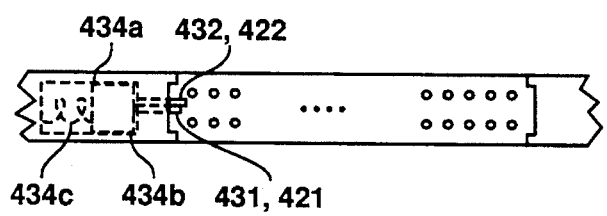

As shown in FIGS. 4A, 4B, and 4C the selectively-engaging IC card receptacle 400 include a first selectively-engaging secondary connection mechanism 420 and a second selectively-engaging secondary connection mechanism 430. The selectively-engaging secondary connection mechanism 420 comprises a conducting contact 421, a keyed nonconducting tip 422, and a positioning mechanism 424. The conducting contact 421 is mechanically attached to the keyed nonconducting tip 422, the keyed nonconducting tip 422 forming at least a partial shroud over the conducting contact 421. It is an important feature of the present invention that the keyed nonconducting tip protrudes in a lateral direction toward the center of the receptacle to a greater distance than the conducting contact 421 protrudes. This provides for non-connection of conducting contact 421 with any planar surface, such as that of an IC card edge, which passes near the selectively-engaging secondary connection mechanism 420, unless the surface is appropriately keyed for the keyed nonconducting tip 422, or unless the surface contains a conducting protruding contact which is outside the scope of the present invention. The keyed nonconducting tip 422 is in turn mechanically attached to the positioning mechanism 424. Positioning mechanism 424, in the present embodiment of the invention, comprises a chamber 424a, a stop block means 424b, and a spring means 424c. When the IC card 300 of FIGS. 3A, 3B, and 3C are initially inserted, the keyed nonconducting tip contacts the edge 310 of the IC card and forces the stop block means 424b toward the rear of the chamber 424a, compressing the spring means 424c. The positioning mechanism 424 retains this configuration, and hence the conducting contact 421 remains retracted, until an appropriately keyed notch such as those shown in FIGS. 4A, 4B, and 4C are positioned adjacent to the nonconducting tip 422.

It is emphasized that in FIG. 3A the notched IC card are shown with trapezoidal-solid-shaped notches, but the invention is not so limited. The notches 320 and 330 may be any of a variety of keyed shapes. Additionally, it is emphasized that the nonconducting tips 422 and 432 in FIGS. 4A, 4B, and 4C can also be any of a variety of keyed shapes. The receptacle 400 and the IC card 300 will be mates where the nonconducting tips 422 and 432 are substantially mated to the keyed shapes of notches 320 and 330, and full electrical contact of the SideSwipe connections will be achieved. When a non-SideSwipe IC card, or a differently-keyed IC card is inserted, there will not be full electrical contact of the SideSwipe connections; however, there will still be the full primary electrical connections achieved at the standard PCMCIA interface at the front of the IC card.

Figure 5A:
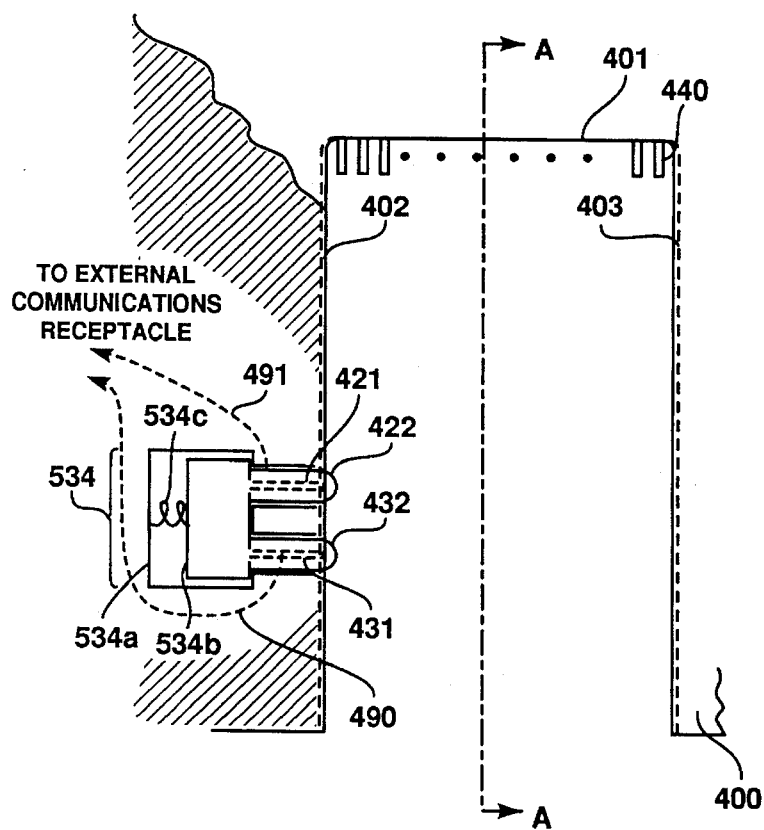
FIGS. 5A, 5B, and 5C illustrate a selectively-coupling IC card receptacle designed in accordance with a second embodiment of the present invention.
Figure 5B:
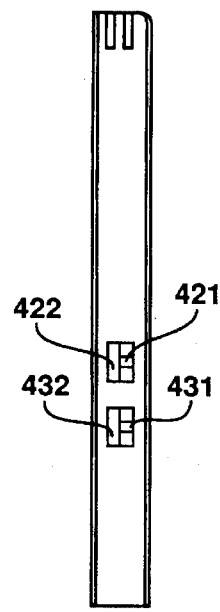
Figure 5C:
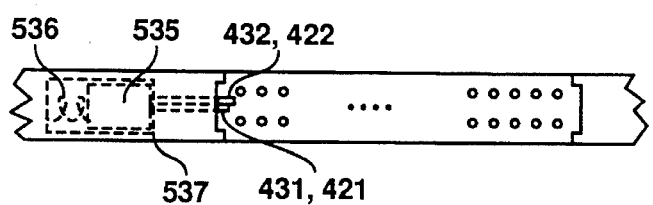

FIGS. 5A, 5B, and 5C show a receptacle for receiving an IC card in accordance with a second embodiment of the present invention, in which a plurality of nonconducting tip/conducting contact combinations corresponds to a single positioning mechanism. In FIGS. 5A, 5B and 5C, the receptacle 400 comprises a single positioning mechanism 534. The positioning mechanism 534 in turn comprises a chamber 534a, a stop block means 534b, and a spring means 534c. The positioning mechanism is mechanically attached to two sets of nonconducting tip/conducting contact combinations, specifically, nonconducting tip 422/conducting contact 421, and nonconducting tip 432/conducting contact 431. When the IC card 300 is inserted into the receptacle of FIGS. 5A, 5B, and 5C, there is at any given point in the insertion process no electrical contact between the conducting tips 421 and 431 with the IC card 300 until the IC card is fully inserted. Because there is only a single positioning mechanism, there needs to be full alignment of both keyed notches 320 and 330 of IC card 300 with the nonconducting tips 422 and 432 before there is any electrical contact. Thus, in this embodiment there will be no incidental electrical contact between conducting tip 431 and conducting surface 321 during the insertion process, since such incidental contact can be undesirable in some cases. The invention is not limited to the case of one positioning mechanism being coupled to two keyed tips. The invention includes the cases of the receptacle 400 having several positioning mechanisms, each being associated with one or more conducting tips. Such an embodiment is especially useful when, in the case of a plurality of conducting tips, it is important that contact is achieved with no tips unless contact is made with all tips.

FIG. 6 illustrates a receptacle 600 for receiving the IC card 300 or other IC card according to a third embodiment of the present invention. In this embodiment, the receptacle 600 comprises a secondary connection mechanism 620 for engaging and disengaging the electrical connections to the IC card 300 and also for mechanically coupling to the inserted IC card so as to lock the IC card into place upon insertion. The secondary connection mechanism 620 includes electrically conducting contacts 621 and 622, respectively, which are through any of a variety of means coupled to an external communications receptacle of the computer. The secondary connection mechanism 620 further comprises a keyed control arm 623 to which the electrically conducting contacts 621 and 622 are attached. Keyed control arm 623 has a keyed shape in an area near the electrically conducting contacts such that the keyed control arm is capable of penetrating corresponding notched on an inserted IC card, such as the notches 320 and 330 of IC card 300 as shown in FIG. 3. The keyed control arm 623 is contained in a chamber 624 which, in this embodiment of the invention, limits the motion of the keyed control arm 623 to a single degree of freedom, i.e. laterally backward and toward the inserted IC card. The keyed control arm 623 is coupled to a positioning mechanism 625. Positioning mechanism 625 is coupled to a controller 626.

The positioning mechanism 625 may be any of a variety of means capable of moving control arm 623 back and forth. Such means include, but are not limited to, an electrical motor and a manual control arm. Additionally, positioning mechanism 625 may contain a locking means which locks the keyed control arm 623 in place when the IC card is inserted. In this way, when an IC card which is keyed for the receptacle 600 is inserted, it will be forcibly retained in the receptacle 600 by the keyed control arm 623. This effect takes place because the keyed control arm 623 penetrates the keyed notches of the inserted notched IC card, inhibiting the inward and outward motion of the IC card until keyed control arm 623 is released by the positioning mechanism 625. The details of the positioning mechanism 625 are not included in FIG. 6 so as not to obscure the present invention. Any of a variety of well-known manual or motor-based positioning and locking means will suffice for the purposes of the present invention.

FIG. 6 also shows a controller 626 coupled to the positioning mechanism 625 via a control bus 627. Controller 626 comprises circuitry which is capable of providing activation, locking, and deactivation signals to positioning mechanism 625. Controller 627 may also be coupled to bus 11 for receiving commands from processor 12 or IC controller 18. In one embodiment of the invention, the user may enter a first command (via keyboard 22 or cursor control 23) to engage the positioning mechanism and lock the card into place. Controller 626 will receive a corresponding command from processor 12 or IC controller 18 and proceed to cause the positioning mechanism to engage and lock. The IC card will remain locked until a second command is entered by the user to unlock and disengage the positioning mechanism, upon which the controller 626 will receive an unlock and disengage command and cause the positioning mechanism 625 to unlock and disengage the keyed control arm 623 from the IC card.

It is emphasized that FIG. 6 illustrates an embodiment of the invention with two electrical SideSwipe contacts attached to a movable keyed control arm, but the invention is not limited to this case. For example, there may be multiple electrical contacts on the keyed control arm. Furthermore, there may be other standard SideSwipe contacts elsewhere along the surfaces 610 and 611 which are not attached to the keyed control arm. Even further, the scope of the invention includes the case where there are no electrical contacts on the keyed control arm, that is, where the keyed control arm is used for locking the notched IC card into place only.

Figure 7:
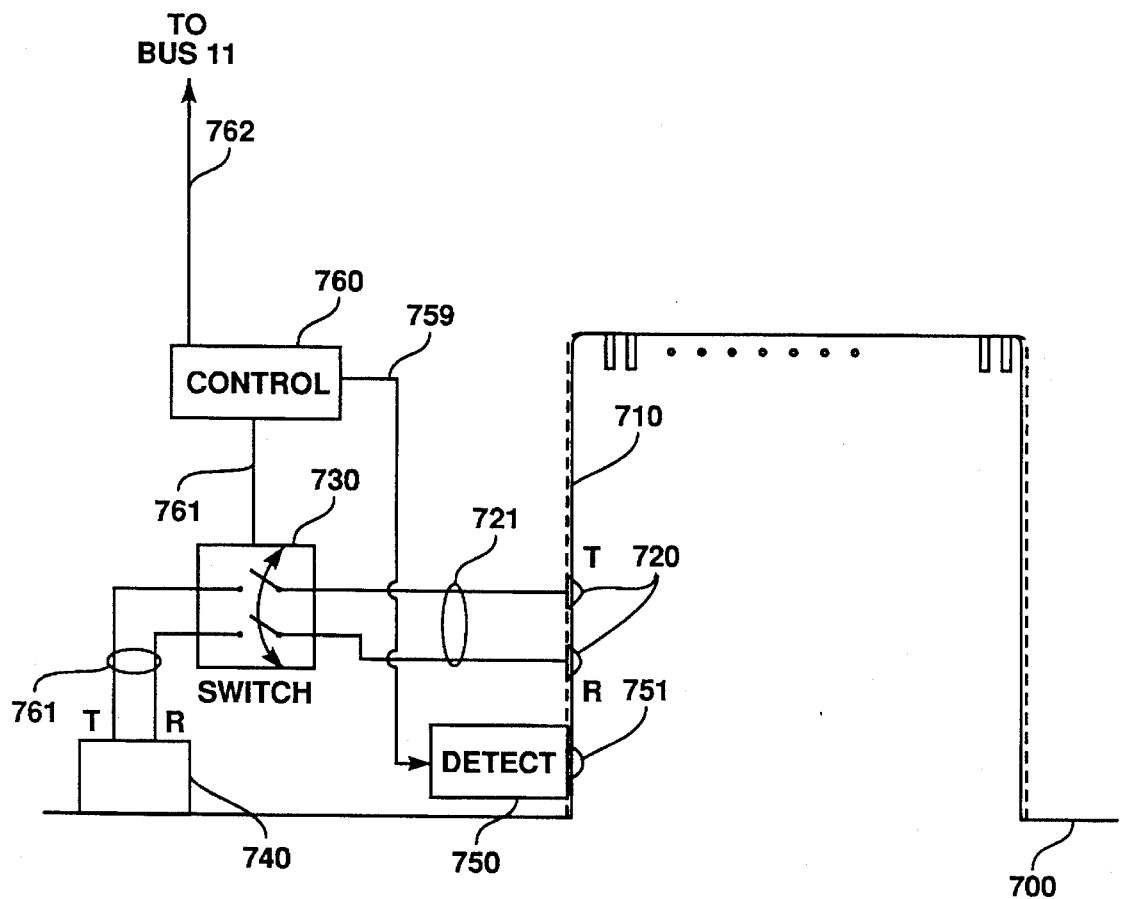
FIG. 7 illustrates a selectively-coupling IC card receptacle designed in accordance with a fourth embodiment of the present invention.
Figure 8:
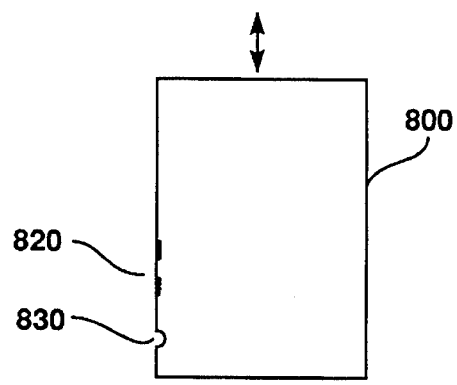
FIG. 8 represents a top view of a keyed notched IC card designed for use with the selectively-coupling IC card receptacle of FIG. 7.

FIG. 7 shows a selectively-coupling integrated circuit card receptacle 700 in accordance with a fourth embodiment of the present invention. The receptacle 700 includes Side-Swipe contacts 720 for electrically coupling to the side contacts of an IC card containing SideSwipe contacts. In this embodiment of the invention the IC card may be the non-keyed IC card 50 as shown in FIG. 2A, or the appropriately keyed IC card 800 as shown in FIG. 8. In the case of the IC card 50 there will be no electrical connectivity between the non-keyed SideSwipe IC card 50 and the external communications receptacle, but there will be electrical connectivity between the appropriately keyed Side-Swipe IC card 800 and the external communications receptacle. FIG. 7 shows the SideSwipe contacts 720 as coupled via leads 721 to a switch 730. Switch 730 is coupled via leads 731 to an external communications receptacle 740, which in this embodiment of the invention includes an RJ11 jack.

Selectively-engaging receptacle 700 further comprises an insertion detector 750. The purpose of the insertion detector 750 is to detect the presence of an IC card during insertion and to detect the full insertion of an appropriately keyed IC card. Insertion detector 750 is coupled via leads 759 to a control unit 760. Control unit 760 is coupled to switch 730 via control leads 761. Additionally, control unit 760 is coupled to bus 11 via lead 762. In this embodiment of the invention, the insertion detector is capable of using any of a variety of well-known means to detect the full insertion of an appropriately keyed IC card such as card 800 and placing a first status signal onto lead 759 thereupon. In response to this first status signal, controller 760 activates switch 730 via lead 761, which then establishes an "on" connection between leads 721 and leads 731, and thus electrical contact is established between SideSwipe contacts 720 and the external communications receptacle 740.

In the receptacle of FIG. 7, when the appropriately keyed IC card is not fully inserted, or when the IC card is not appropriately keyed for the insertion detector 750 of the receptacle 700, a second status signal is placed by insertion detector 750 onto lead 759. In response to this second status signal, controller 760 de-activates switch 730 via lead 761, which then disconnects leads 721 from leads 731 and thus there is no electrical connection between SideSwipe contacts 720 and the external communications receptacle 740. Thus, for example, if the inserted IC card is a non-SideSwipe card, which is non-keyed, and if the IC card contains a metallic surface, there will be no shorting together of the SideSwipe contacts 720. This produces a desired result in the case where the external communications receptacle is coupled, for example, to a telephone line but where the receptacle is being used by a metallic-surfaced IC card which has a different purpose such as a LAN interface—a false "off-hook" condition is avoided.

It is noted that the insertion detector 750 may use a variety of well-known means to detect full insertion of an appropriately keyed IC card. Such means include mechanical, electrical, or optical means. For example, the insertion detector may comprise a keyed control arm which is mated to a corresponding notch on a desired IC card. The insertion detector may alternatively comprise an optical transmitter for transmitting light at a point near the location of the keyed notch 830 when the card is fully inserted, and an optical receiver positioned neat by such that a first amount of light is received from the optical transmitter when the IC card 800 is not fully inserted and a second amount of light is received from the optical transmitter when the IC card 800 is fully inserted.

Controller 760 is also coupled to bus 11 of the computer system via leads 762. In certain cases it may be necessary for the computer system, either automatically or by explicit user command, to override the result of the output of the insertion detector. Such a circumstance may arise, for example, when the inserted IC card has the appropriate SideSwipe connections but not the appropriate keyed notches, or when the inserted IC card contains notches mated to the detector but lacks the appropriate SideSwipe contacts. In this circumstance override signals can be transmitted via leads 762 to controller 760, and the switch 730 activated or deactivated accordingly.

Thus, an apparatus for achieving an interface between a removably insertable integrated circuit card having side contacts and a computer system containing an external communications receptacle has been described. Whereas many alterations and applications of the present invention will no doubt become apparent to a person of ordinary skill in the art after reading the foregoing description, it is understood that the particular embodiments shown and described by illustration are in no way intended to be limiting. Therefore, references to details of the preferred embodiments are not intended to limit the scope of the claims which themselves recite only those features regarded as essential to the invention.

What is claimed is:

1. A notched integrated circuit (IC) card for use in a computer system, said notched IC card comprising:
    a logic circuit for performing a designated function;
    a primary electrical interface coupled to said logic circuit for transferring a plurality of signals between the IC card and the computer system, said primary electrical interface including a plurality of pins;
    an IC card frame for providing a support structure for said logic circuit and said primary electrical interface, said card frame enclosing the logic circuit and holding said plurality of pins in place for connection into the computer system, said card frame including a plurality of edges, wherein at least one of said plurality of edges is formed such that at least one recessed notch having a keyed shape is defined along said edge;
    a secondary electrical contact for routing at least one signal located on the IC card to said computer system, said secondary electrical contact including:
        a conducting surface located within one of said recessed notches such that said conducting surface is beneath the plane of the edge containing said recessed notch;
        a selectively-engaging secondary connection mechanism that includes a conductive contact connected to said computer, a non-conducting tip of a keyed shape which protrudes beyond said conductive contact and fits into said notch, and a positioning mechanism for moving said conductive contact into electrical contact with said secondary electrical contact beneath the plane of the edge containing said recessed notch.

2. The notched IC card of claim 1, wherein the primary electrical interface corresponds to a pre-defined IC card interface.

3. The notched IC card of claim 2, wherein the standardized IC card interface is the PCMCIA standard.

4. The notched IC card of claim 1, wherein said keyed shape is defined by a (1) an approximately 0.261 inch by approximately 0.055 inch rectangle at the surface of said edge, narrowing to (2) an approximately 0.025 by approximately 0.055 inch rectangle at a plane parallel to the surface of said edge and recessed approximately 0.063 inches from the surface of said edge, and wherein said conducting surface of said secondary contact lies in a plane which is recessed approximately 0.030 inches from the surface of said edge.

5. In a computer system containing an external communications receptacle, a selectively-coupling integrated circuit (IC) card receptacle (1) for receiving the body of an IC card having a primary set of IC card contacts along a first surface and a secondary IC card contact recessed within a first recessed notch formed by a second surface and (2) for selectively electrically coupling said IC card to said computer system, said IC card receptacle comprising:
    a primary surface and a plurality of secondary surfaces for receiving and supporting the body of said inserted IC card;
    a primary electrical interface located along said primary surface to allow electrical interconnection between said primary set of IC card contacts with said computer system upon insertion of said IC card into said IC card receptacle;
    a selectively-engaging secondary connection mechanism located near one of said plurality of secondary surfaces of said IC card receptacle for selectively coupling said secondary IC card contact to said external communications receptacle, said selectively-engaging secondary connection mechanism comprising:
        an electrically conducting contact located near said secondary surface of said IC card receptacle, said electrically conducting contact being coupled to said external communications receptacle;

a positioning mechanism coupled to said electrically conducting contact for projecting and retracting said electrically conducting contact away from and toward said IC card;

a means for controlling said positioning mechanism such that direct contact between said electrically conducting contact and said second surface of said IC card is completely avoided during the insertion of the IC card into the IC card receptacle, and such that contact is capable of being established between said electrically conducting contact and said secondary IC card contact of said IC card only when said IC card is fully inserted into said IC card receptacle.

6. The selectively-coupling IC card receptacle of claim 5, wherein said positioning mechanism is a spring loading mechanism, and wherein said means for controlling said positioning mechanism includes a non-conducting shroud fixably attached to said electrically conducting contact, such that said shroud contacts said second surface of said IC card during insertion of the IC card and operably keeps said electrically conducting contact at a fixed distance from said second surface until said shroud contacts said first recessed notch formed by second surface of said IC card.

7. The selectively-coupling IC card receptacle of claim 6, wherein said non-conducting shroud forms a substantially semi-circular plane above said electrically conducting contact in a plane substantially parallel to the plane of the largest surface of said IC card when said IC card is fully inserted into said IC card receptacle.

8. The selectively-coupling IC card receptacle of claim 5, said positioning mechanism of said selectively-engaging secondary connection mechanism comprising a motor.

9. The selectively-coupling IC card receptacle of claim 5, said positioning mechanism of said selectively-engaging secondary connection mechanism comprising:

a control arm fixably attached to said electrically conducting surface; and a manual lever coupled to said control arm such that said control arm is capable of being manually positioned.

10. The selectively-coupling IC card receptacle of claim 5, said positioning mechanism of said selectively-engaging secondary connection mechanism comprising a control arm fixably attached to said electrically conducting surface and having a keyed shape such that at least a portion of said control arm is capable of penetrating the space formed by said first recessed notch when said IC card is fully inserted into said IC card receptacle, said means for controlling said positioning mechanism including a locking mechanism coupled to said control arm, such that said control arm is capable of forcibly retaining said IC card in said IC card receptacle when said IC card is fully inserted in said IC card receptacle.

11. The selectively-coupling IC card receptacle of claim 5, said IC card including a second recessed notch formed by said second surface, said selectively-coupling IC card receptacle further comprising:

a keyed control arm movably coupled to said secondary surface of said selectively-coupling IC card receptacle having a keyed shape such that at least a portion of said keyed control arm is capable of penetrating the space formed by said second recessed notch of said IC card when said IC card is fully inserted into said IC card receptacle; and a locking mechanism coupled to said keyed control arm such that said keyed control arm is capable of forcibly retaining said IC card in said IC card receptacle when said IC card is fully inserted in said IC card receptacle.

12. The selectively-coupling IC card receptacle of claim 5, said IC card including a second recessed notch formed along a third surface, said selectively-coupling IC card receptacle further comprising:

a keyed control arm movably coupled to a second secondary surface of said selectively-coupling IC card receptacle, said keyed control arm having a keyed shape such that at least a portion of said keyed control arm is capable of penetrating the space formed by said second recessed notch of said IC card when said IC card is fully inserted into said IC card receptacle; and a locking mechanism coupled to said keyed control arm such that said keyed control arm is capable of forcibly retaining said IC card in said IC card receptacle when said IC card is fully inserted in said IC card receptacle.

13. The selectively-coupling IC card receptacle of claim 5, said IC card including a second recessed notch formed by said second surface, said positioning mechanism of said selectively-coupling IC card receptacle further comprising:

a keyed control bar comprising:

a main surface movably mounted to said secondary surface of said IC card receptacle, said main surface being movable in a direction substantially perpendicular to said secondary surface, wherein said main surface is mounted so as to remain substantially parallel to said secondary surface;

a first protrusion located on said main surface and coupled to said electrically conducting contact; and a second protrusion located on said main surface at a distance away from said first protrusion corresponding to the distance between said first recessed notch of said IC card and said second recessed notch of said IC card;

wherein said means for controlling said positioning mechanism is a spring-loaded mechanism coupled to said positioning mechanism, such that said electrically conducting contact is capable of penetrating the plane of said second surface of said IC card only when said IC card is fully inserted in said IC card receptacle.

* * * * *

UNITED STATES PATENT AND TRADEMARK OFFICE
CERTIFICATE OF CORRECTION

PATENT NO. : 5,619,660
DATED : April 8, 1997
INVENTOR(S) : Scheer et al.

It is certified that error appears in the above-identified patent and that said Letters Patent is hereby corrected as shown below:

In column 1 at line 24 delete "FOR" (second occ.) and insert --FORM--.

In column 2 at line 43 delete "fine," and insert --line,--

In column 11 at line 31 delete "neat by" and insert --nearby--

Signed and Sealed this

Fifteenth Day of July, 1997

*Attest:*

BRUCE LEHMAN

*Attesting Officer*   *Commissioner of Patents and Trademarks*